(12) United States Patent
Kumar et al.

(10) Patent No.: US 10,405,425 B2
(45) Date of Patent: Sep. 3, 2019

(54) SURFACE MOUNT TECHNOLOGY (SMT) PAD DESIGN WITH DIFFERENTIAL CONTACT STRIPS HAVING CONVERGING NARROWING DISTAL ENDS THAT FACILITATE HIGH SPEED COMMUNICATION

(71) Applicant: DELL PRODUCTS, L.P., Round Rock, TX (US)

(72) Inventors: Vijendera Kumar, Bangalore (IN); Bhyrav M. Mutnury, Austin, TX (US); V. Mallikarjun Goud, Secunderabad (IN)

(73) Assignee: Dell Products, L.P., Round Rock, TX (US)

( * ) Notice: Subject to any disclaimer, the term of this patent is extended or adjusted under 35 U.S.C. 154(b) by 0 days.

(21) Appl. No.: 15/626,244

(22) Filed: Jun. 19, 2017

(65) Prior Publication Data
US 2018/0368259 A1 Dec. 20, 2018

(51) Int. Cl.
| | |
|---|---|
| *H01R 13/6596* | (2011.01) |
| *H05K 1/11* | (2006.01) |
| *H01R 12/72* | (2011.01) |
| *H05K 1/02* | (2006.01) |

(52) U.S. Cl.
CPC ............ *H05K 1/111* (2013.01); *H01R 12/72* (2013.01); *H05K 1/0219* (2013.01)

(58) Field of Classification Search
CPC ........ H01R 12/72; H01R 11/09; H01R 9/091; H01R 12/52; H01R 12/714; H01R 13/652; H01R 13/6596; H01R 23/72; H05K 1/111

USPC ............. 439/68-73, 83, 101-108, 721-723; 361/767
See application file for complete search history.

(56) References Cited

U.S. PATENT DOCUMENTS

| | | | |
|---|---|---|---|
| 6,069,323 A | 5/2000 | Slupek et al. | |
| 6,337,798 B1 | 1/2002 | Hailey et al. | |
| 6,752,635 B1 | 6/2004 | Searls et al. | |
| 8,085,550 B2 | 12/2011 | Hoffmeyer et al. | |
| 9,576,932 B2 | 2/2017 | Williams et al. | |
| 9,775,245 B2 * | 9/2017 | Akagawa | H05K 1/111 |
| 2002/0039857 A1 * | 4/2002 | Naito | H01R 23/6873 439/493 |

(Continued)

*Primary Examiner* — Harshad C Patel
(74) *Attorney, Agent, or Firm* — Isidore PLLC

(57) ABSTRACT

An Information handling system (IHS) includes a circuit board assembly with surface mount technology (SMT) pad structure. Landing pad(s) attached to circuit board substrate have a mounting area that receive an SMT connector pin onto adjacent pair of differential contact strips plated to nonconductive surface and extending longitudinally in parallel alignment. A return current strip is longitudinally aligned, adjacent to the differential contact strips on a first lateral side. The return current strip is connected to a ground plane of the circuit board substrate. Converging narrowing of the adjacent differential contact strip increases separation from a distal end of the return current strip. The separation improves signal integrity by reducing fringe effects, increasing impedance, and quenching resonance. A surface mount device (SMD) has one or more connector pins that are attached to the one or more landing pads to conduct the high-speed communication signal.

14 Claims, 11 Drawing Sheets

(56) References Cited

U.S. PATENT DOCUMENTS

2005/0161254 A1\* 7/2005 Clink .................. H05K 1/0245
174/262
2010/0149766 A1 6/2010 Hoss et al.
2017/0105284 A1\* 4/2017 Akagawa .......... H01L 23/49844

\* cited by examiner

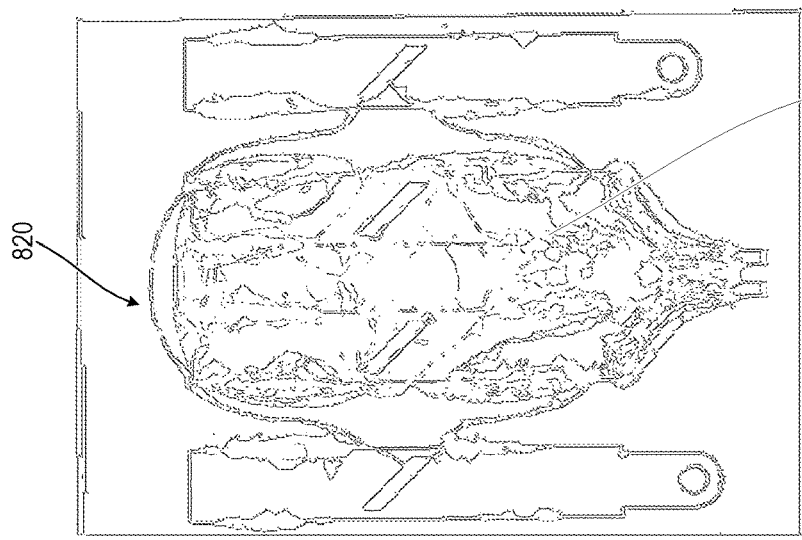
FIG. 8C *(Prior Art)*
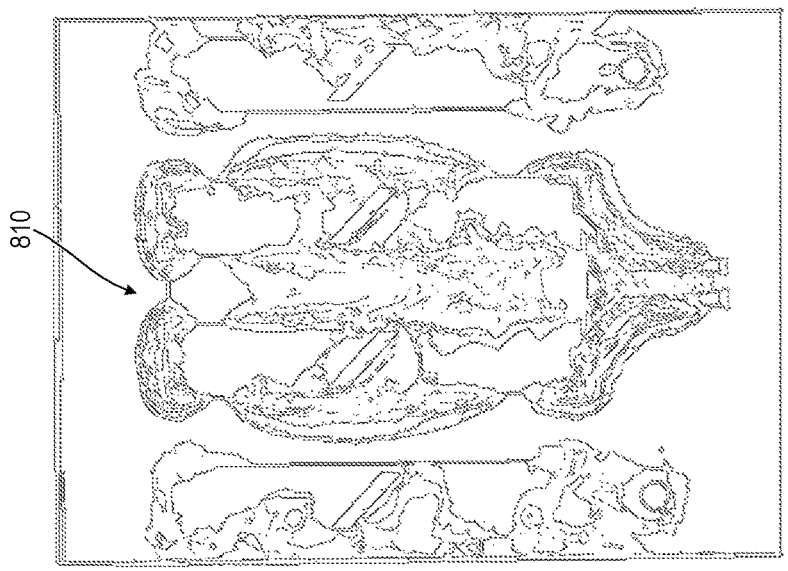
FIG. 8B *(Prior Art)*
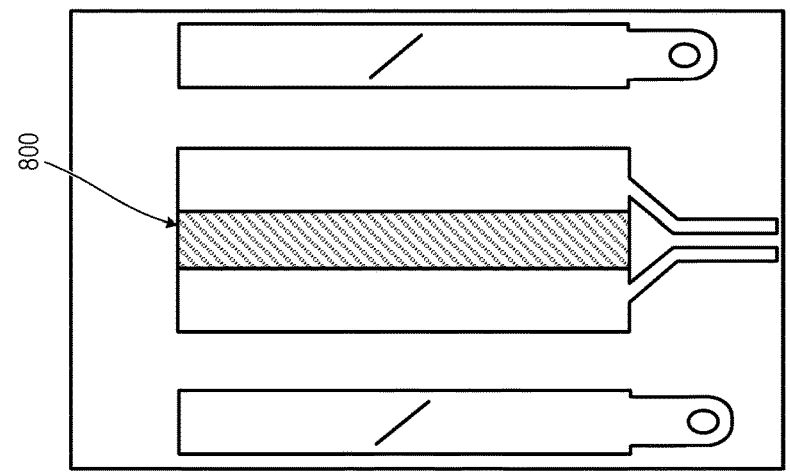
FIG. 8A *(Prior Art)*

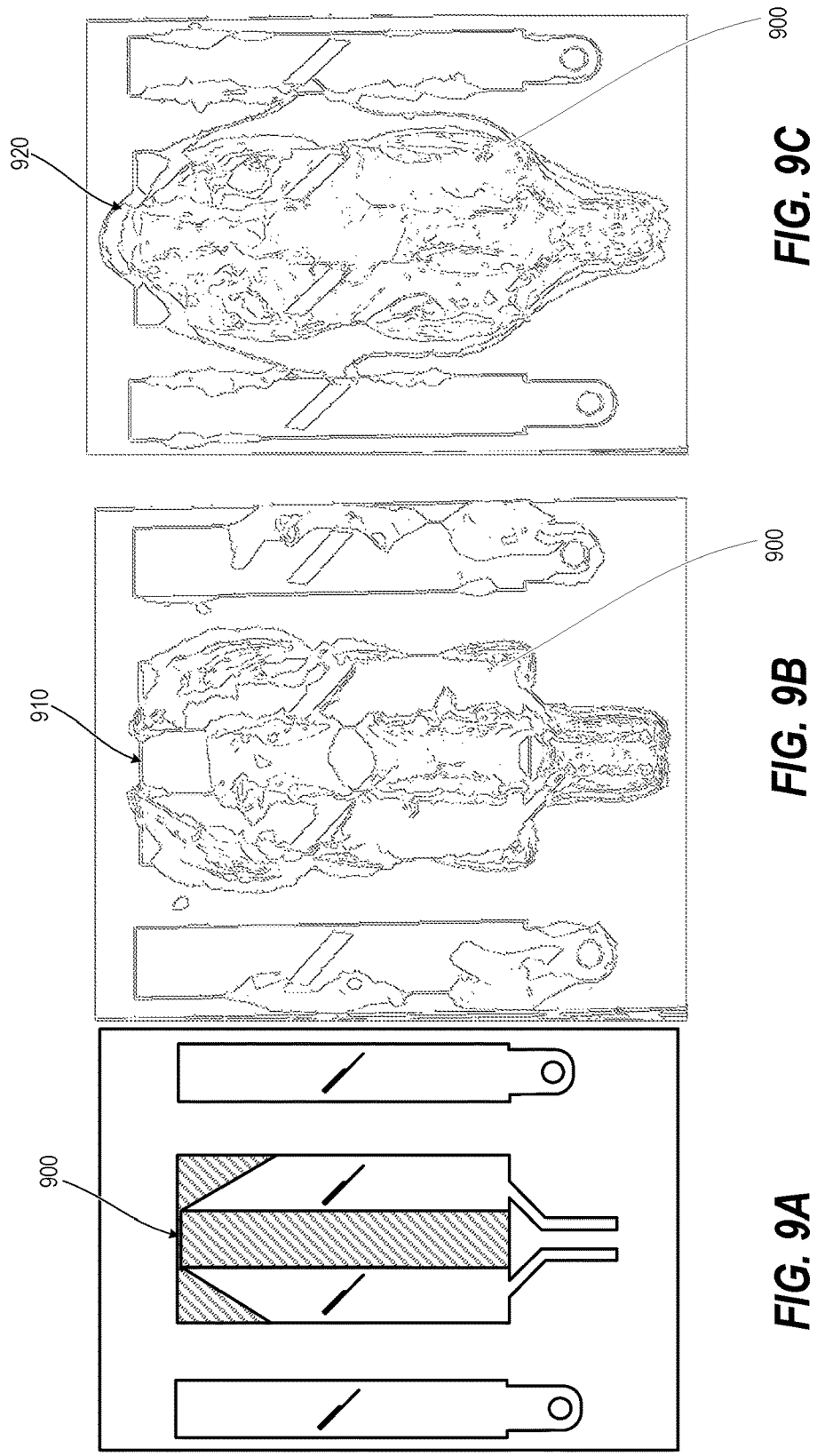

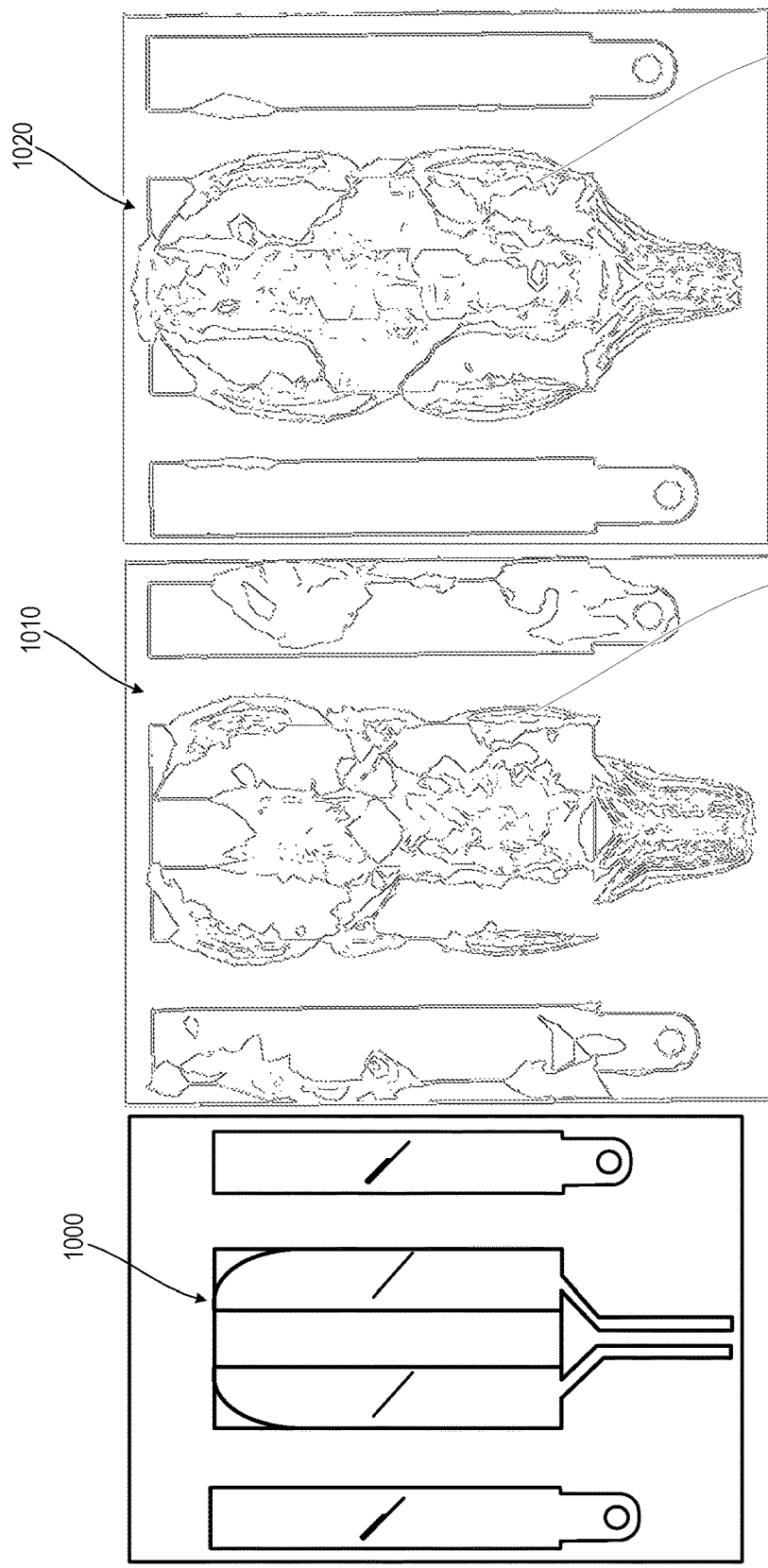

SURFACE MOUNT TECHNOLOGY (SMT) PAD DESIGN WITH DIFFERENTIAL CONTACT STRIPS HAVING CONVERGING NARROWING DISTAL ENDS THAT FACILITATE HIGH SPEED COMMUNICATION

BACKGROUND

1. Technical Field

The present disclosure relates in general to a surface mounted integrated circuit in an information handling system (IHS), and more particularly to surface mount technology (SMT) connector pads for a surface mount device (SMD) in an IHS.

2. Description of the Related Art

As the value and use of information continue to increase, individuals and businesses seek additional ways to process and store information. One option available to users is information handling systems (IHSs). An IHS generally processes, compiles, stores, and/or communicates information or data for business, personal, or other purposes, thereby allowing users to take advantage of the value of the information. Because technology and information handling needs and requirements vary between different users or applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

Printed circuit boards (PCBs) in IHSs are increasingly using surface mount technology (SMT) connectors for high speed signaling. SMT connectors provide better impedance control than other integrated circuit (IC) mounting technologies. Conventional connectors, such as plated through hole (PTH) or press-fit connectors, do not provide the same signal integrity benefits as SMT connectors. With increasing communication speeds, additional considerations for signal integrity become necessary even for SMT connectors.

BRIEF SUMMARY

In accordance with the teachings of the present disclosure, an information handling system (IHS) includes a circuit board assembly having a circuit board substrate and a surface mount technology (SMT) pad structure. One or more landing pads of the SMT pad structure are attached to the circuit board substrate. Each landing pad has a mounting area that is longitudinally sized to receive an SMT connector pin within a longitudinal mounting displacement tolerance value. Each landing pad has an adjacent pair of differential contact strips plated to a nonconductive surface and longitudinally extending in parallel alignment. Each differential contact surface has converging narrowing of each strip at a distal end and has a proximal signal trace for conducting a high-speed communication signal to another functional component attached to the circuit board substrate. A return current strip is longitudinally aligned adjacent to the pair of differential contact strips on a first lateral side. The return current strip is connected to a ground plane of the circuit board substrate. The converging narrowing of the adjacent differential contact strip increases separation from a distal end of the return current strip. The separation improves signal integrity by reducing fringe effects, increasing impedance, and quenching resonance. A surface mount device (SMD) has one or more connector pins that correspond to and are attached to the one or more landing pads to conduct the high-speed communication signal.

In accordance with embodiments of the present disclosure, a circuit board assembly of an IHS includes a SMT pad structure. One or more landing pads of the circuit board assembly are attached to the circuit board substrate. Each landing pad has a mounting area that is longitudinally sized to receive an SMT connector pin within a longitudinal mounting displacement tolerance value. Each landing pad has an adjacent pair of differential contact strips plated to a nonconductive surface and longitudinally extending in parallel alignment. Each differential contact surface has converging narrowing of each strip at a distal end. Each differential contact surface has a proximal signal trace for conducting a high-speed communication signal to another functional component attached to the circuit board substrate. The circuit board assembly has a return current strip that is longitudinally aligned adjacent to the pair of differential contact strips on a first lateral side. The return current strip is connected to a ground plane of the circuit board substrate. The converging narrowing of the adjacent differential contact strip increases separation from a distal end of the return current strip. The separation improves signal integrity by reducing fringe effects, increasing impedance, and quenching resonance. The circuit board assembly includes a SMD having one or more connector pins that correspond to and are attached to the one or more landing pads to conduct the high-speed communication signal.

According to illustrative embodiments of the present disclosure, a method includes attaching an adjacent pair of differential contact strips to a nonconductive surface of respective landing pads of a SMT pad structure of a circuit board substrate. The pair of differential contact strips have converging narrowing at a respective distal end. Each differential contact strip has a proximal signal trace for conducting a high-speed communication signal to another functional component attached to a circuit board substrate. The method includes attaching a return current strip that is longitudinally aligned adjacent to the pair of differential contact strips on a first lateral side. The return current strip is connected to a ground plane of the circuit board substrate. The converging narrowing of the adjacent differential contact strip increases separation from a distal end of the return current strip. The separation improves signal integrity by reducing fringe effects, increasing impedance, and quenching resonance. The method includes attaching a SMD having one or more connector pins that correspond to and are attached to the one or more landing pads to conduct the high-speed communication signal and to form a circuit board assembly of an information handling system.

The above presents a general summary of several aspects of the disclosure in order to provide a basic understanding of at least some aspects of the disclosure. The above summary contains simplifications, generalizations and omissions of detail and is not intended as a comprehensive description of the claimed subject matter but, rather, is intended to provide a brief overview of some of the functionality associated therewith. The summary is not intended to delineate the scope of the claims, and the summary merely presents some concepts of the disclosure in a general form as a prelude to the more detailed description that follows. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which:

FIG. 8A illustrates a top view of a generally-known 4 mm rectangular pad;

FIG. 8B illustrates a top view of simulated electric fields (E-Fields) generated by the generally-known 4 mm rectangular pad;

FIG. 8C illustrates a top view of a graphical depiction of magnetic fields (H-Fields) generated by the generally-known 4 mm rectangular pad;

FIG. 9A illustrates a top view of the straight tapered pad, according to one or more embodiments;

FIG. 9B illustrates a top view of a graphical depiction of E-Fields generated by the straight tapered pad, according to one or more embodiments;

FIG. 9C illustrates a top view of a graphical depiction of H-Fields generated by the straight tapered pad, according to one or more embodiments;

FIG. 10A illustrates a top view of the curved tapered pad, according to one or more embodiments;

FIG. 10B illustrates a top view of a graphical depiction of E-Fields generated by the curved tapered pad, according to one or more embodiments;

FIG. 10C illustrates a top view of a graphical depiction of H-Fields generated by the curved tapered pad, according to one or more embodiments.

DETAILED DESCRIPTION

Figure 1:
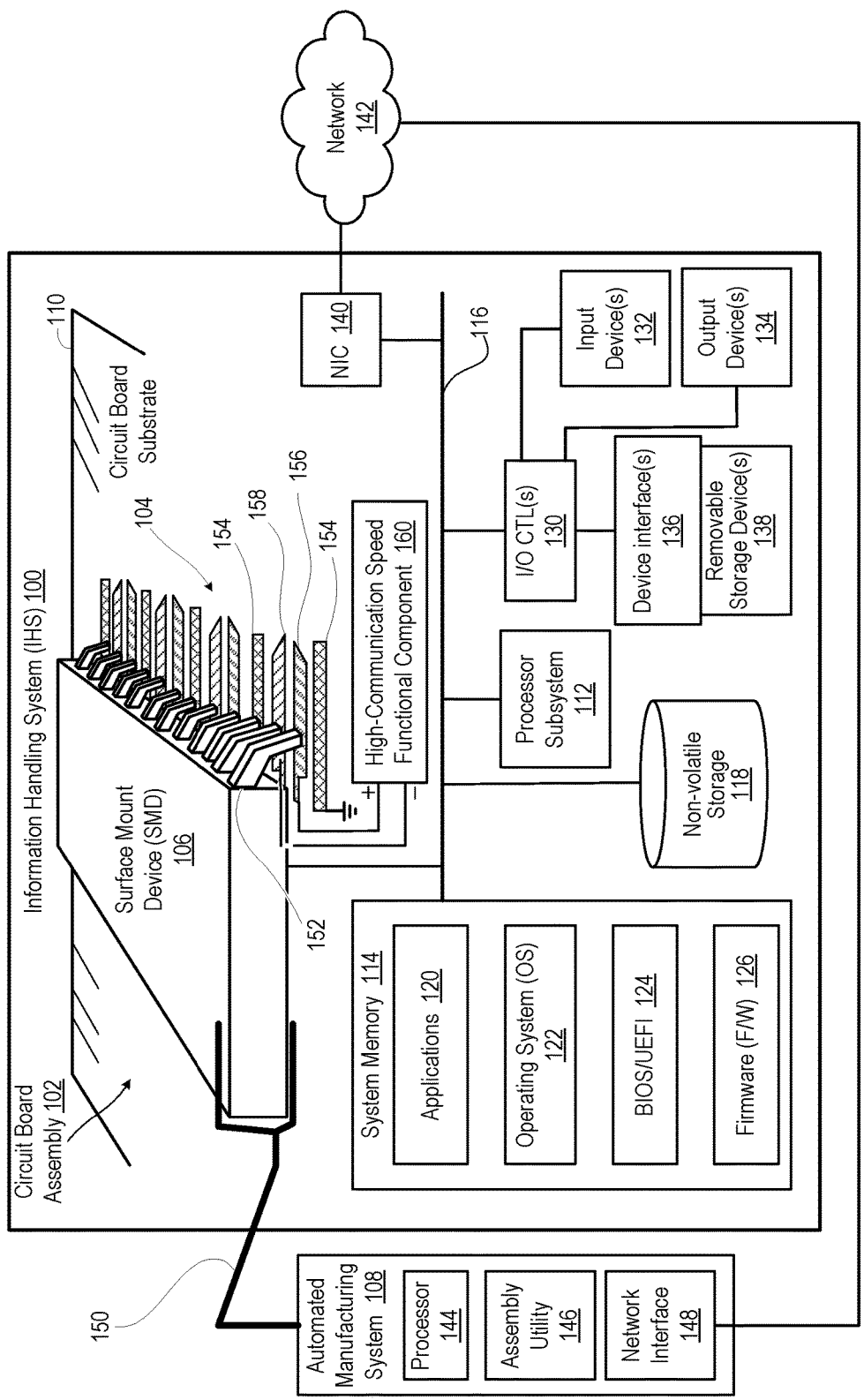
FIG. 1 illustrates a block diagram representation of an example information handling system (IHS) having a circuit board assembly that incorporates surface mount technology (SMT) landing pads, according to one or more embodiments.

According to the present disclosure, an information handling system (IHS) includes a circuit board assembly with surface mount technology (SMT) pad structure that has improved signal integrity for next generation communication signal speeds. Landing pad(s) attached to circuit board substrate have a mounting area that receive an SMT connector pin onto an adjacent pair of differential contact strips plated to nonconductive surface and longitudinally extending in parallel alignment. Return current strip is longitudinally aligned adjacent to the pair of differential contact strips on a first lateral side. The return current strip is connected to a ground plane of the circuit board substrate. Converging narrowing of the adjacent differential contact strip increases separation from a distal end of the return current strip. Separation improves signal integrity by reducing fringe effects, increasing impedance, and quenching resonance. A surface mount device (SMD) has one or more connector pins that correspond to and are attached to the one or more landing pads to conduct the high-speed communication signal.

The present innovation recognizes that current SMT landing pad dimensions can create problems at next generation speeds of greater than 12 Gbps. The present innovation further recognizes that providing sufficient size for mechanical registration and stability of SMT connector also provides more coupling area. With more capacitive coupling, crosstalk between channels increases, insertion loss increases, and impedance is lowered. The current return path carries a significant level of current causing resonances. The present innovation recognizes that a distal, unused portion of the landing pad acts as a microstrip monopole at these frequencies and creates unsatisfactory signal integrity for next generation communication signals. The present innovation addresses these deficiencies with a differential contact strip design with satisfactory size for mechanical registration with reduced coupling with the return current strip for improved signal integrity.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not other embodiments.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that terms is utilized.

FIG. 1 illustrates a block diagram representation of an example information handling system (IHS) 100 having a circuit board assembly 102 that incorporates SMT landing pads 104 for mounting of one or more SMDs 106. The circuit board assembly 102 is economically assembled by an automated manufacturing system 108 with placement tolerances (defined in the description of FIG. 2 below) on a circuit board substrate 110 of the circuit board assembly 102. Features of the SMT landing pads 104 provide satisfactory signal integrity for next generation communication signals that pass through the SMT landing pads 104, even providing the placement tolerances.

Within the general context of IHSs, the IHS 100 may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an IHS may be a personal computer, a PDA, a consumer electronic device, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Referring again to FIG. 1, IHS 100 has a processor subsystem 112 that is coupled to system memory 114 via system interconnect 116. System interconnect 116 can be interchangeably referred to as a system bus, in one or more embodiments. Also coupled to system interconnect 116 is non-volatile storage (e.g., a non-volatile random access memory (NVRAM) storage 118, within which can be stored one or more software and/or firmware modules and one or more sets of data that can be utilized during operations of management IHS 100. These one or more software and/or firmware modules can be loaded into system memory 114 during operation of management IHS 100. Specifically, in one embodiment, system memory 114 can include therein a plurality of such modules, including one or more of application(s) 120, operating system (OS) 122, basic input/output system (BIOS) or Uniform Extensible Firmware Interface (UEFI) 124, and firmware (F/W) 126. These software and/or firmware modules have varying functionality when their corresponding program code is executed by processor subsystem 112 or secondary processing devices within management IHS 100. For example, application(s) 120 may include a word processing application, a presentation application, and a management station application, among other applications.

IHS 100 further includes one or more input/output (I/O) controllers 130 which support connection by and processing of signals from one or more connected input device/s 132, such as a keyboard, mouse, touch screen, or microphone. I/O controllers 130 also support connection to and forwarding of output signals to one or more connected output devices 134, such as a monitor or display device or audio speaker(s). Additionally, in one or more embodiments, one or more device interfaces 136, such as an optical reader, a USB, a card reader, Personal Computer Memory Card International Association (PCMCIA) slot, and/or a high-definition multimedia interface (HDMI), can be associated with IHS 100. Device interface(s) 136 can be utilized to enable data to be read from or stored to corresponding removable storage device(s) 138, such as a compact disk (CD), digital video disk (DVD), flash drive, or flash memory card. In one or more embodiments, device interface(s) 136 can further include general purpose I/O interfaces such as inter-integrated circuit ($I^2C$), system management bus (SMB), and peripheral component interconnect (PCI) buses.

IHS 100 comprises a network interface controller (NIC) 140. NIC 140 enables IHS 100 and/or components within IHS 100 to communicate and/or interface with other devices, services, and components that are located external to IHS 100. These devices, services, and components can interface with IHS 100 via an external network, such as example network 142, using one or more communication protocols that include transport control protocol/internet protocol (TCP/IP) and network block device (NBD) protocol. Network 142 can be a local area network, wide area network, personal area network, and the like, and the connection to and/or between network and IHS 100 can be wired, wireless, or a combination thereof. For purposes of discussion, network 142 is indicated as a single collective component for simplicity. However, it should be appreciated that network 142 can comprise one or more direct connections to other devices as well as a more complex set of interconnections as can exist within a wide area network, such as the Internet.

The SMT landing pads 104 are formed on an exposed surface of the circuit board assembly 102 by etching from copper sheets laminated onto a surface of a non-conductive, circuit board substrate 110. The SMT landing pads 104 have sufficient size for mechanical registration and stability to enable economical manufacture and assembly of surface mount devices (SMDs) onto the circuit board assembly 102 using automated processes. As illustrated within the figure, the automated manufacturing system 108 can be an IHS 100 such as including a processor 144 that executes an assembly utility 146 under remote management via a network interface 148 that communicates with network 142. A robotic end effector 150 can place connector pins 152 of the surface mount device (SMD) 106 onto the SMT landing pads 104 for attachment, such as by soldering. The SMT landing pads 104 include return current strips 154 to one or both lateral sides of a pair of differential contact strips 156, 158 that are electrically connected as positive and negative values to a high communication speed functional component 160 of the IHS 100.

Figure 2:
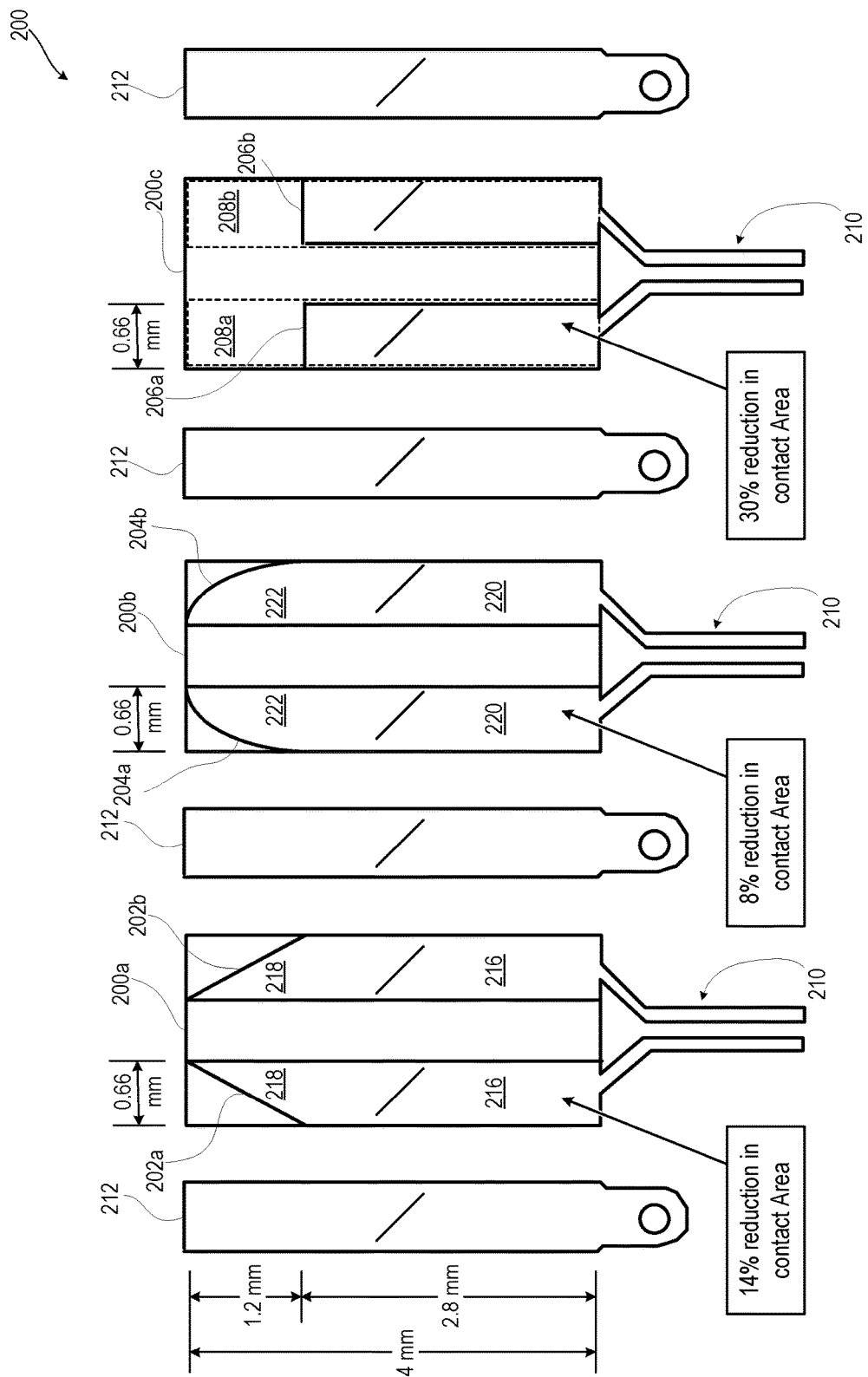
FIG. 2 illustrates a top detail view of three versions of SMT differential contact strips for SMT landing pads, according to one or more embodiments.

FIG. 2 illustrates SMT landing pads 200, which includes three versions of landing pads 200a, 200b, 200c that respectively include differential pairs of tapered, rounded and shortened contact strips 202a-202b, 204a-204b, 206a-206b respectively. Each of the landing pads 200a, 200b, 200c are shown to improve signal integrity at next generation speeds over a generally-known baseline contact strips (shown in phantom) 208a-208b. The width of the baseline contact strips are selected to make suitable contact area with the MSD 106 (FIG. 1). The length is selected based on the placement tolerance of an automated manufacturing system 108 (FIG. 1). In the presented example, the conventional baseline contact strips are two parallel and rectangular contact strips of 4 mm in longitudinal length and 0.66 mm laterally wide each for a contact area of 2.64 mm². Proximally attached traces 210 communicate with other functional components 160 (FIG. 1). The 4 mm of longitudinal length provides adequate placement tolerance for a connector pin 152 (FIG. 1). In particular, the 4 mm longitudinal length provides an economical tolerance for automated assembly of an SMD having contact area of each connector pin of about 0.5 to 0.8 mm in longitudinal length. However, generally a distal portion of the Baseline contact strips 208a-208b extend out as monopole stubs that can create electromagnetic transmission problems at high communication speeds, such as speeds exceeding 12 gigabytes per second (Gbps). Current can be received by a flanking pair of return current strips 212 due to fringe effects and resonance. Generally, the return current strips 212 provide a benefit since one or the other of contact strips 208a-208b can have an imbalanced amount of current due to differences in propagation effects on both sides of the current flow. However, in this instance, creation of a resonance on the unused distal portion of the contact strips 208a-208b lowers the impedance and degrades insertion and return losses.

The shortened contact strips 206a-206b provide a control case illustrating avoidance of a stub portion by shortening longitudinal length to 2.8 mm. However, the shortened contact strips 206a-206b require a more complex and costly approach to automated assembly in order to place the connector pins 152 (FIG. 1) on this reduced longitudinal length. By contrast, the tapered and rounded differential contact strips contact strips 202a-202b, 204a-204b of the present disclosure maintain a 4 mm longitudinal length for economical assembly, but also incorporate a converging, narrowing of a distal portion to create separation from the flanking return current strips 212 on each lateral side. The amount of contact area removed is 14% and 8% respectively. The resulting reduction in fringe effect and corresponding improvement in signal integrity is far greater than this modest removal of contact area would suggest. The increased impedance quenches any resonance by the converging, narrowing distal stubs. In one or more embodiments, each return current strip 212 is connected by a plated through-hole or via to a ground plane of the circuit board assembly 102 (FIG. 1) and is not part of a landing pad.

In exemplary embodiments, the pair of tapered differential contact strips 202a-202b each have a proximal rectangular portion 216 of 2.8 mm in longitudinal length and 0.66 mm in lateral width that transitions to a distal right triangle portion 218 also of initial width 0.66 mm. The distal right triangle portion 218 has internally opposed sides of 1.2 mm in longitudinal length with a linear tapered side toward a closest return current strip 212. The pair of rounded differential contact strips 204a-204b each have a proximal rectangular portion 220 of 2.8 mm in longitudinal length and 0.66 mm in lateral width that transitions to a distal curved blade portion 222 also of initial width 0.66 mm. The distal curved blade portion 222 has internally opposed sides of 1.2 mm in longitudinal length with a rounded side toward a closest return current strip 212.

Figure 3:
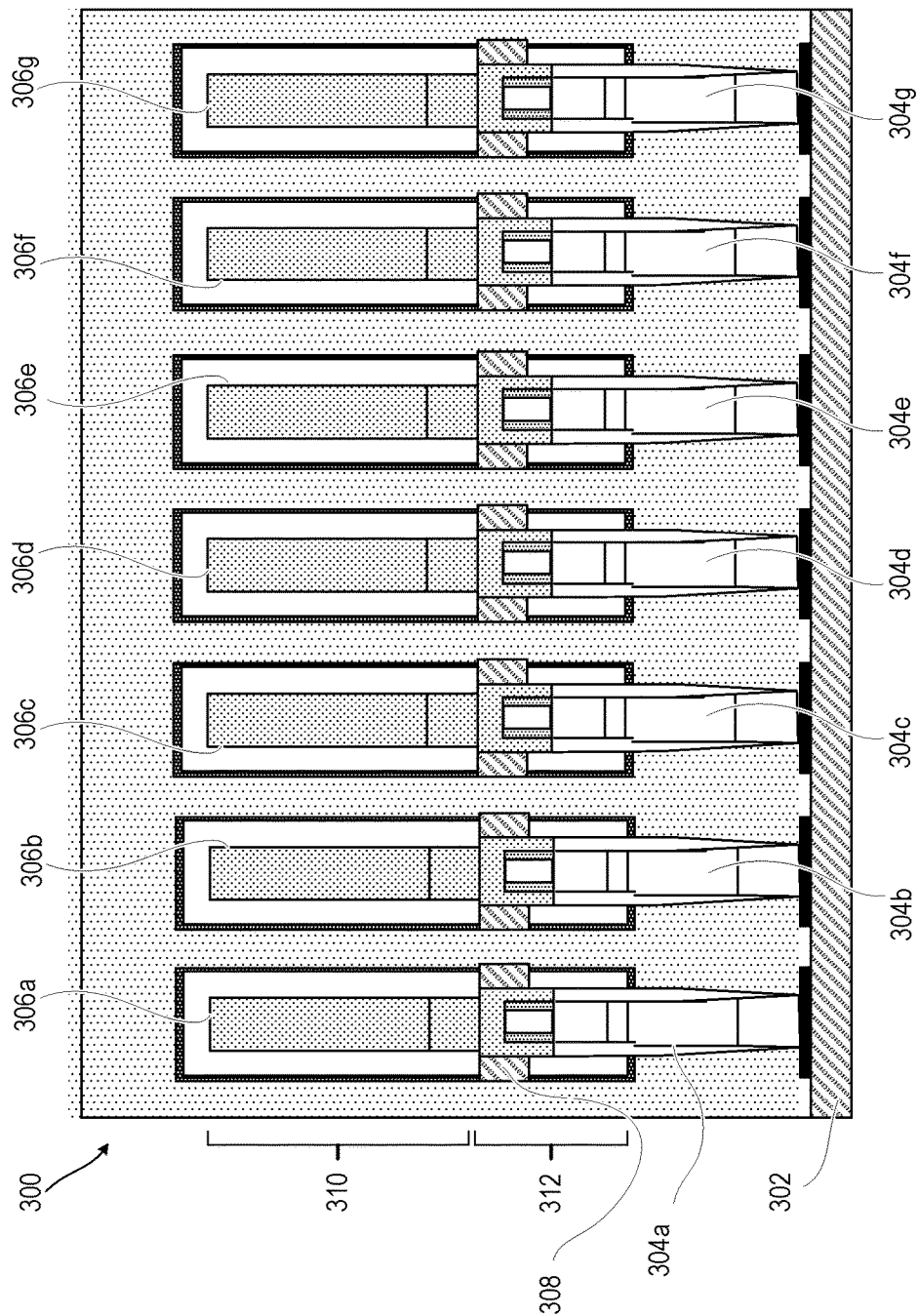
FIG. 3 illustrates a top detail view of connection pins of a surface mount device (SMD) attached to two of the three versions of SMT differential contact strips, according to one or more embodiments.

FIG. 3 illustrates a circuit board assembly 300 formed by SMD 302 having connector pins 304a-304g mounted respectively to SMT landing pads 306a-306g. For clarity, details of the contact strips for low speed communication signals and differential high speed communication signals are omitted as well as omitting return current paths. Each of landing pads 306a-306g provides economical mechanical registration for the connector pins 304a-304g. The present innovation can avoid or mitigate an aggravating factor of communication speeds going beyond 12 Gbps to 16 Gbps and 24 Gbps. In addition, the SMT landing pads 306a-306g do not compromise the mechanical sturdiness of the connector by maintaining the required pad height for mechanical reliability. The length of the tapered section can be controlled and based on modeling and simulation results. A range from 0.5 to 0.3 times of the total pad length is recommended. FIG. 3 illustrates a scenario when mechanical registration tolerance results in placement of the contact pin contact 308 creating a relatively large distal, unused portion 310 of each landing pads 306a-306g and a relatively short proximal, used portion 312.

Figure 4:
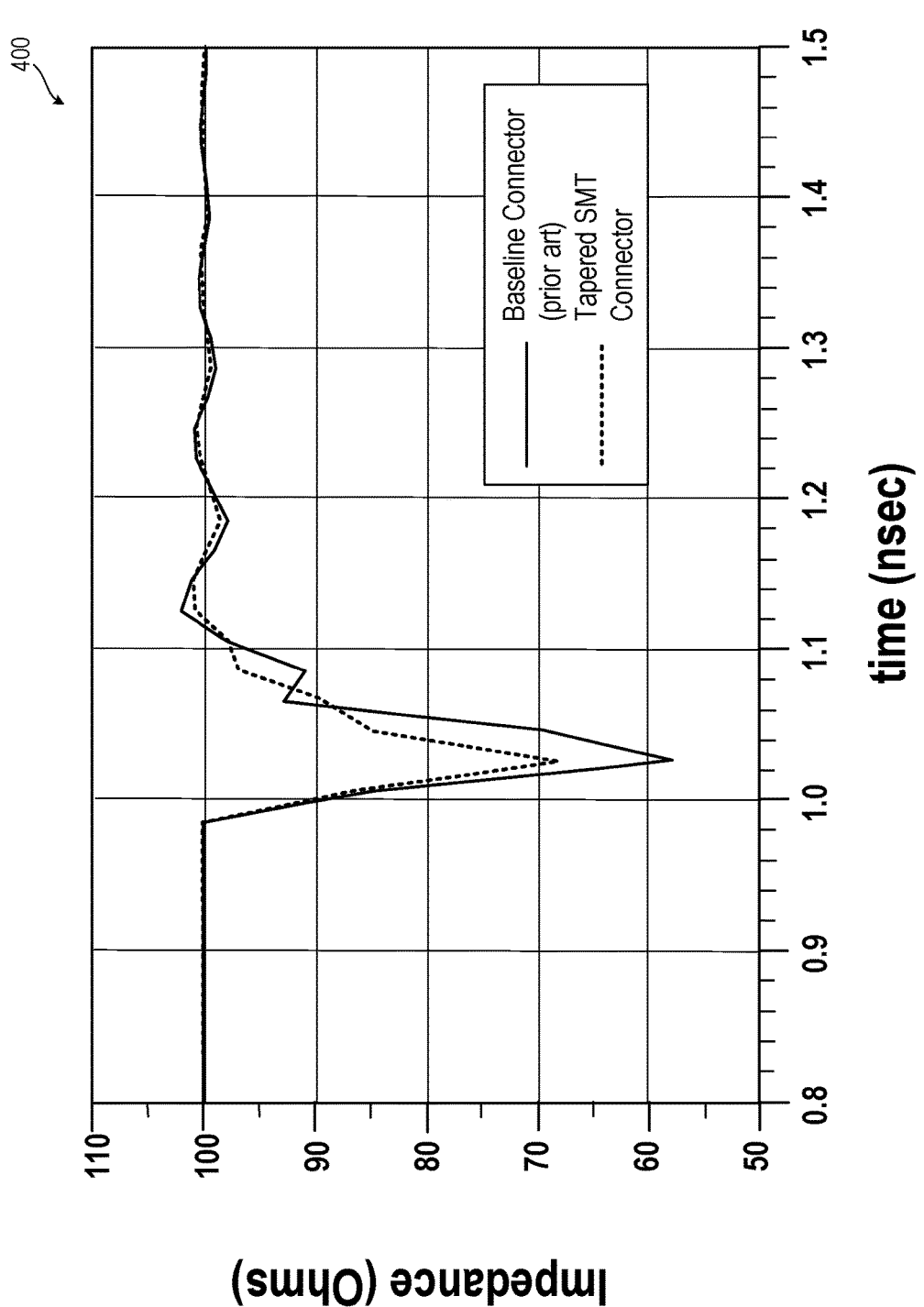
FIG. 4 illustrates a time domain graphical plot of impedance profiles of a generally-known 4 mm differential contact strip ("baseline connector") and a straight tapered differential contact strip, according to one or more embodiments.

FIG. 4 illustrates a graphical plot 400 of the generally-known baseline SMT connector of a pin soldered to a baseline SMT pad compared against the tapered landing pad. The tapering reduces the fringe effect and also improves an impedance profile. Additionally, as shown in FIG. 3, the edges of the landing pads can be been made spherical for reducing charge distribution. Time domain analysis shows there is no charge on the return current pads and this will result in quenching the resonance. As illustrated in FIG. 4, impedance is improved by 10-15 Ohms with the tapered design.

Figure 5:
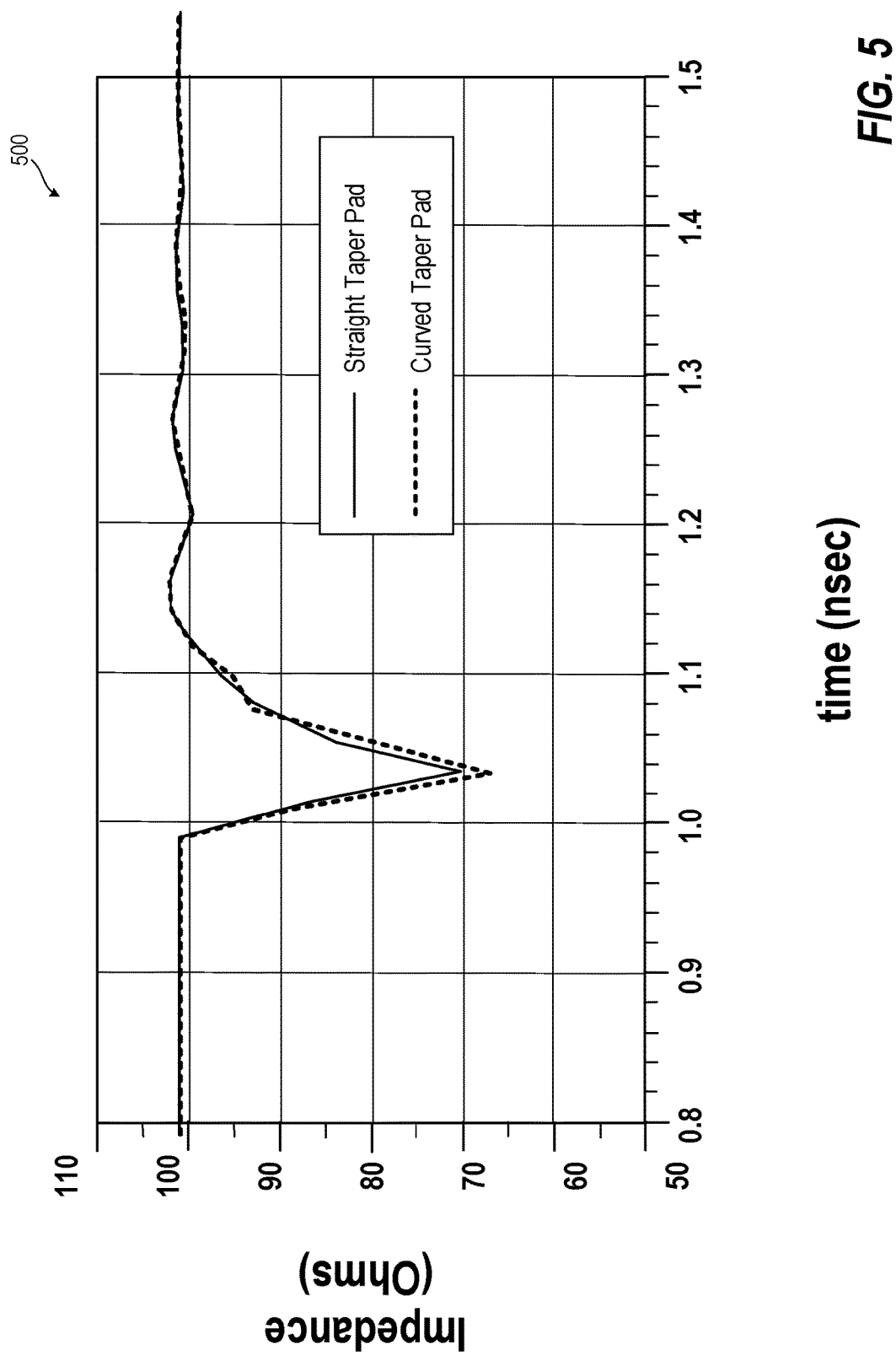
FIG. 5 illustrates a time domain graphical plot of impedance profiles of the straight tapered differential contact strip and a curved tapered differential contact strip, according to one or more embodiments.

FIG. 5 illustrates a graphical plot 500 of the straight tapered contact strip compared against the curved tapered contact strip. Although the amount of contact surface removed differs respectively from 14% to 8% , the curved and straight tapered contact surfaces have similar impedance profiles.

Figure 6:
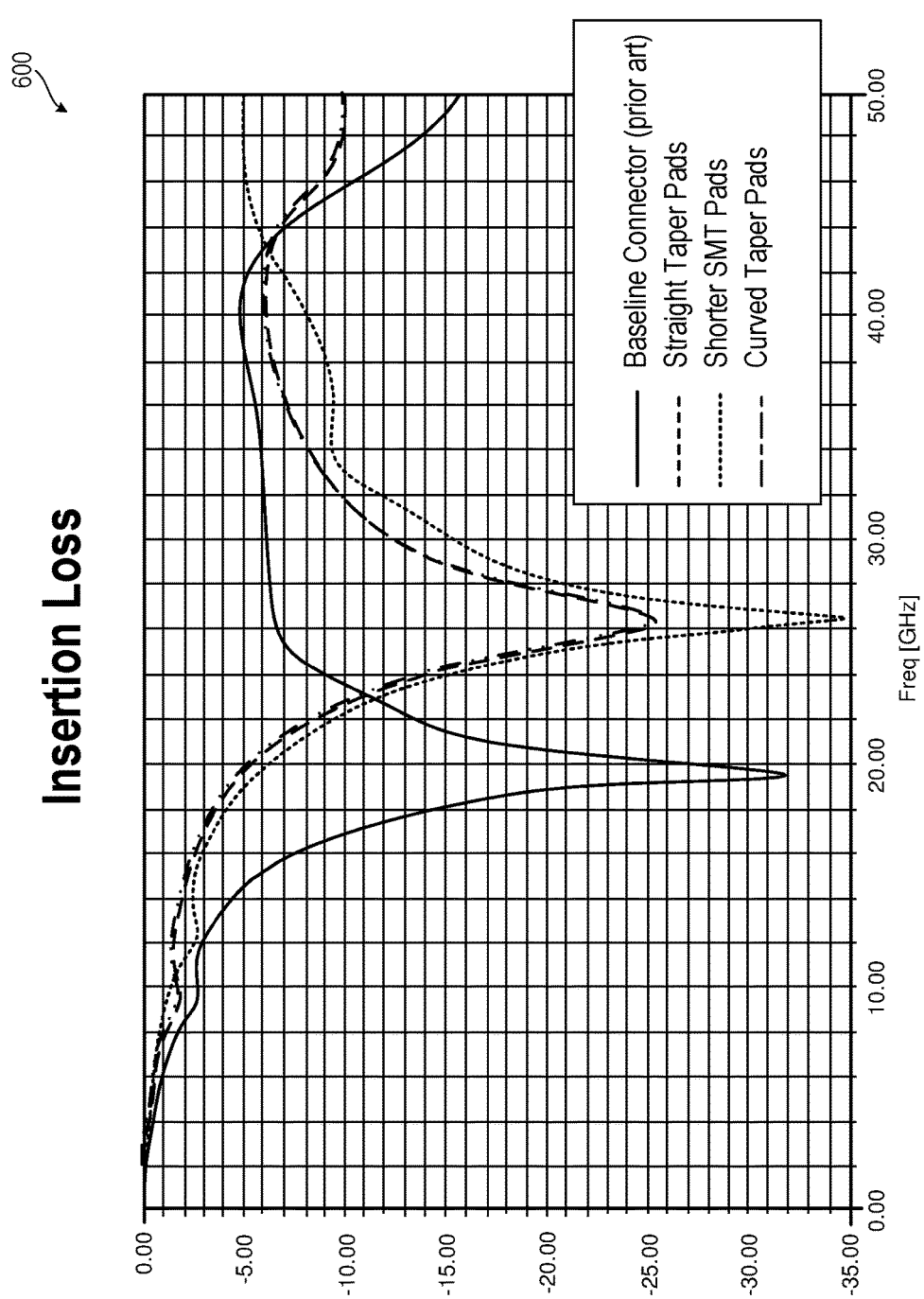
FIG. 6 illustrates a frequency domain graphical plot of insertion loss of the baseline connector, the straight tapered differential contact strip, the curved tapered differential contact strip and a control shortened differential contact strip, according to one or more embodiments.
Figure 7:
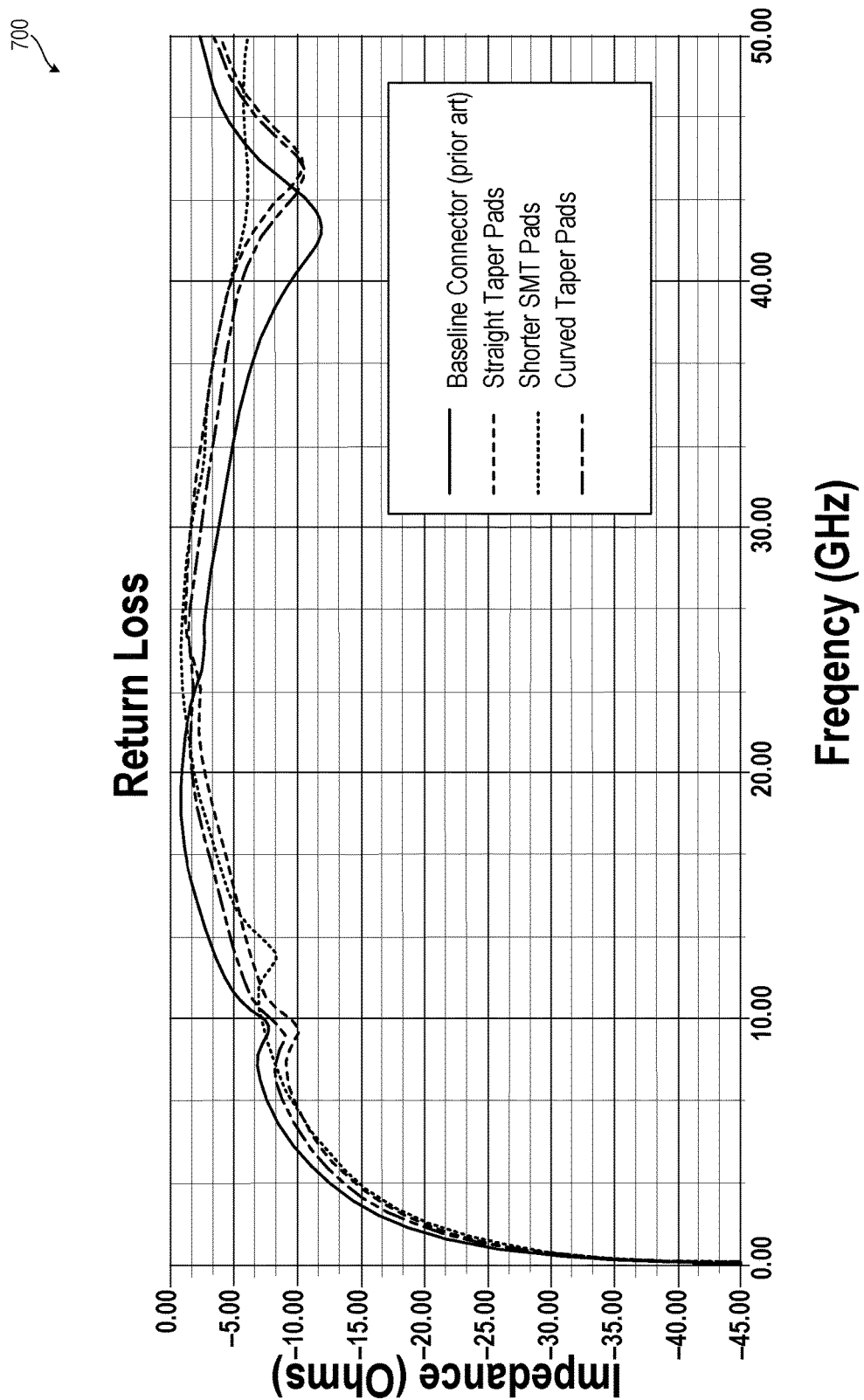
FIG. 7 illustrates a frequency domain graphical plot of return loss of the baseline connector, the straight tapered differential contact strip, the curved tapered differential contact strip and the control shortened differential contact strip, according to one or more embodiments.

FIG. 6 illustrates a frequency domain graphical plot 500 of insertion loss of the baseline connector, the straight tapered differential contact strip, the curved tapered differential contact strip and a control shortened differential contact strip, according to one or more embodiments. FIG. 7 illustrates a frequency domain graphical plot 700 of return loss of the baseline connector, the tapered differential contact strip, and the control shortened differential contact strip, according to one or more embodiments. The tapered and rounded contact strips perform comparable to the expensive shortened contact strip approach. The present innovation thus is shown to provide a number of desirable attributes: (i) mechanical stability is maintained while ensuring superior electrical performance for next generation speeds; (ii) a cost effective solution reduces the electrical field density and results in superior electrical performance; (iii) decreasing capacitive effect is introduced by landing pads and thereby the impedance is improved; (iv) better return loss and insertion loss are achieved; and (v) crosstalk is mitigated because of the differential property maintained at the landing pad edges.

FIG. 8A illustrates a generally-known 4 mm rectangular pad 800. FIG. 8B illustrates a graphical depiction 810 of electric fields (E-Fields) generated by the generally-known 4 mm rectangular pad 800. FIG. 8C illustrates a graphical depiction 820 of magnetic fields (H-Fields) generated by the generally-known 4 mm rectangular pad 800. Significant fringe effects and charge accumulation is evident that corresponds to the reduction in impedance.

FIG. 9A illustrates a straight tapered pad 900. FIG. 9B illustrates a graphical depiction 910 of E-Fields generated by the straight tapered pad 900. FIG. 9C illustrates a graphical depiction 920 of simulated H-Fields generated by the straight tapered pad 900. Fringe effects are greatly reduced corresponding to the increase in impedance.

FIG. 10A illustrates a curved tapered pad 1000. FIG. 10B illustrates a graphical depiction 1010 of E-Fields generated by the curved tapered pad 1000. FIG. 10C illustrates a graphical depiction 1020 of simulated H-Fields generated by the curved tapered pad 1000. Fringe effects are greatly reduced corresponding to the increase in impedance. In addition the greater length of the curved surface than a straight surface reduces charge accumulation.

Figure 11:
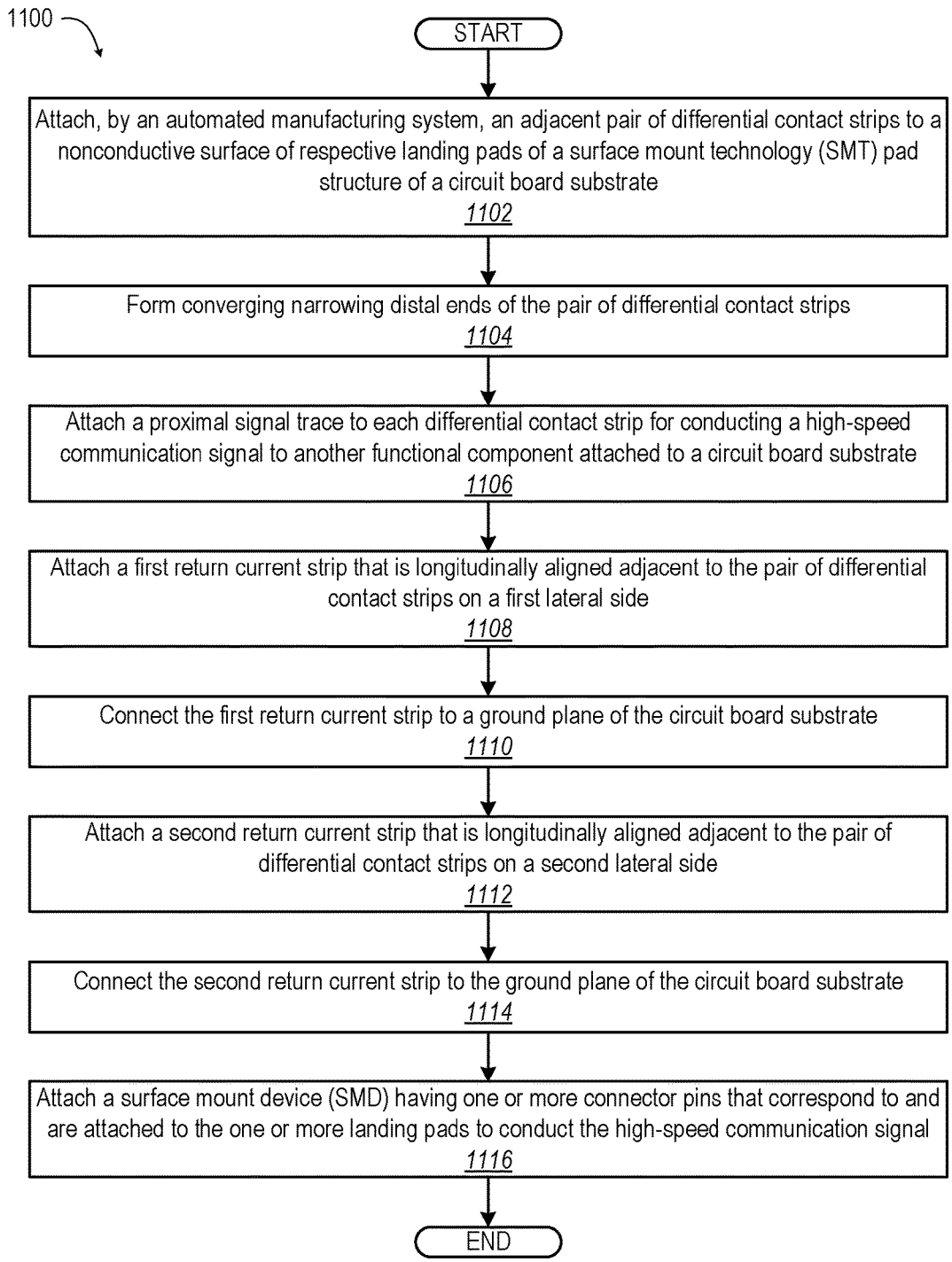
FIG. 11 illustrates a flow diagram of a method of making a circuit board assembly of an IHS having SMT landing pads, according to one or more embodiments.

FIG. 11 illustrates a flowchart of an exemplary methods 1100 by which an automated manufacturing system 108 (FIG. 1) and/or an IHS 100 (FIG. 1) performs different aspects of the processes that enable the one or more embodiments of the disclosure. Generally, method 1100 represents computer-implemented methods. The description of method 1100 is provided with general reference to the specific components illustrated within FIG. 1.

Specifically, FIG. 11 illustrates a method 1100 for making a circuit board assembly with SMT landing pads capable of next generation communication signal speeds with sufficient signal integrity. In one or more embodiments, method 1100 begins with attaching, by an automated manufacturing system, an adjacent pair of differential contact strips to a nonconductive surface of respective landing pads of a surface mount technology (SMT) pad structure of a circuit board substrate (block 1102). Method 1100 includes forming converging narrowing distal ends of the pair of differential contact strips (block 1104). Method 1100 includes attaching a proximal signal trace to each differential contact strip for conducting a high-speed communication signal to another functional component attached to a circuit board substrate (block 1106). Method 1100 includes attaching a first return current strip that is longitudinally aligned adjacent to the pair of differential contact strips on a first lateral side (block 1108). Method 1100 includes connecting the first return current strip to a ground plane of the circuit board substrate (block 1110). Method 1100 includes attaching a second return current strip that is longitudinally aligned adjacent to the pair of differential contact strips on a second lateral side (block 1112). Method 1100 includes connecting the second return current strip to the ground plane of the circuit board substrate (block 1114). The converging narrowing of the adjacent differential contact strip increases separation from a distal end of the return current strip. The separation improves signal integrity by reducing fringe effects, increasing impedance, and quenching resonance. Method 1100 includes attaching a surface mount device (SMD) having one or more connector pins that correspond to and are attached to the one or more landing pads to conduct the high-speed communication signal (block 1116). Method 1100 forms a circuit board assembly of an information handling system.

In one or more embodiments, the converging narrowing of each strip is a tapered end. In one or more embodiments, the converging narrowing of each strip is a rounded end. The longitudinal length of the converging narrowing portion of each strip of the pair of differential contact strips can be within a range of 30-50% of a total longitudinal length of the respective landing pad.

In the above described flow chart of FIG. 11, one or more of the methods may be embodied in an automated manufacturing controller that performs a series of functional processes. In some implementations, certain steps of the methods are combined, performed simultaneously or in a different order, or perhaps omitted, without deviating from the scope of the disclosure. Thus, while the method blocks are described and illustrated in a particular sequence, use of a specific sequence of functional processes represented by the blocks is not meant to imply any limitations on the disclosure. Changes may be made with regards to the sequence of processes without departing from the scope of the present disclosure. Use of a particular sequence is therefore, not to be taken in a limiting sense, and the scope of the present disclosure is defined only by the appended claims.

One or more of the embodiments of the disclosure described can be implemented, at least in part, using a software-controlled programmable processing device, such as a microprocessor, digital signal processor or other processing device, data processing apparatus or system. Thus, it is appreciated that a computer program for configuring a programmable device, apparatus or system to implement the foregoing described methods is envisaged as an aspect of the present disclosure. The computer program may be embodied as source code or undergo compilation for implementation on a processing device, apparatus, or system. Suitably, the computer program is stored on a carrier device in machine or device readable form, for example in solid-state memory, magnetic memory such as disk or tape, optically or magneto-optically readable memory such as compact disk or digital versatile disk, flash memory, etc. The processing device, apparatus or system utilizes the program or a part thereof to configure the processing device, apparatus, or system for operation.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. A circuit board assembly of an information handling system (IHS), the circuit board assembly comprising:
   a circuit board substrate having a nonconductive surface;
   a surface mount technology (SMT) pad structure comprising:
      one or more landing pads formed on an exposed surface of the circuit board substrate and having a mounting area that is longitudinally sized to receive an SMT connector pin of a surface mount device (SMD) within a placement tolerance, each landing pad comprising:
         an adjacent pair of differential contact strips plated to the nonconductive surface and longitudinally extending in parallel alignment, the differential contact strips having converging narrowing of each strip at a distal end and having a proximal signal trace for conducting a high-speed communication signal to another functional component attached to the circuit board substrate, wherein a longitudinal length of a converging narrowing portion of each strip of the pair of differential contact strips is within a range of 30-50% of a total longitudinal length of the respective landing pad; and
         a return current strip that is longitudinally aligned adjacent to the pair of differential contact strips and connected to a ground plane of the circuit board substrate, the converging narrowing of the adjacent differential contact strip increasing separation of a distal end of the adjacent differential contact strip from the return current strip, the increased separation reducing coupling with the return current strip and consequently improving signal integrity by reducing fringe effects, increasing impedance, and quenching resonance to support high speed communication signals passing through the SMT landing pad at next generation speeds of greater than 12 Gigabytes per second; and
   the surface mount device (SMD) having one or more connector pins that correspond to and are attached to the one or more landing pads to conduct high-speed communication signals.

2. The circuit board assembly of claim 1, wherein the converging narrowing of each strip comprises a tapered end that provides an increased impedance, which quenches any resonance by the converging, narrowing distal ends of the strip.

3. The circuit board assembly of claim 2, wherein the converging narrowing to provide the tapered end provides a removal at the distal end of 14% of a contact area of each strip.

4. The circuit board assembly of claim 1, wherein the converging narrowing of each strip comprises a rounded end that provides an increased impedance, which quenches any resonance by the converging, narrowing distal ends of the strip.

5. The circuit board assembly of claim 4, wherein the converging narrowing to provide the rounded end provides a removal at the distal end of 8% of a contact area of each strip.

6. The circuit board assembly of claim 4, wherein the converging narrowing provides a greater length of curved surface which reduces charge accumulation at each strip.

7. The circuit board assembly of claim 1, further comprising a next return current strip that is longitudinally aligned adjacent to the pair of differential contact strips and on an opposite side to the return current strip, the next return current strip connected to the ground plane of the circuit board substrate, the return current strip and next return current strip extending on lateral sides of the pair of differential contact strips that are electrically connected as positive and negative values to a high communication speed functional component of the IHS.

8. The circuit board assembly of claim 1, wherein the SMT landing pad is formed by:
   attaching a metallic layer onto a surface of the circuit board substrate;
   etching the metallic layer to leave the adjacent pair of differential contact strips;
   attaching a return current strip; and
   attaching a raised rectangular ridge around the adjacent pair of differential contact strips to form the landing pad to guide the SMT connector pin of the SMD.

9. The IHS of claim 1, further comprising a next return current strip that is longitudinally aligned adjacent to the pair of differential contact strips and on an opposite side to the return current strip, the next return current strip connected to the ground plane of the circuit board substrate, the return current strip and next return current strip extending on lateral sides of the pair of differential contact strips that are electrically connected as positive and negative values to a high communication speed functional component of the IHS.

10. The IHS of claim 9, wherein the SMT landing pad is form by:
   attaching a metallic layer onto a surface of the circuit board substrate;
   etching the metallic layer to leave the adjacent pair of differential contact strips;
   attaching a return current strip; and
   attaching a raised rectangular ridge around the adjacent pair of differential contact strips to form the landing pad to guide the SMT connector pin of the SMD.

11. The circuit board assembly of claim 1, wherein the converging narrowing of the adjacent differential contact strip ensures superior electrical performance for next generation speeds, while maintaining mechanical stability of the strip, decreases capacitive effect by the landing pads resulting in improved impedance, achieves better return loss and insertion loss, and mitigates crosstalk because of a differential property maintained at edges of the landing pads, and reduces electrical field density and results in superior electrical performance of the landing pads.

12. An information handling system (IHS) comprising:
   a circuit board assembly comprising:
      a circuit board substrate having a nonconductive surface;
      a surface mount technology (SMT) pad structure comprising:
         one or more landing pads formed on an exposed surface of the circuit board substrate and having a mounting area that is longitudinally sized to receive an SMT connector pin of a surface mount device (SMD) within a longitudinal mounting displacement tolerance value, each landing pad comprising:
            an adjacent pair of differential contact strips plated to the nonconductive surface and longitudinally extending in parallel alignment, the differential contact strips having converging narrowing of each strip at a distal end and having a proximal signal trace for conducting a high-speed communication signal to another functional component attached to the circuit board substrate, wherein a longitudinal length of a converging narrowing portion of each strip of the pair of differential contact strips is within a range of 30-50% of a total longitudinal length of the respective landing pad; and a return current strip that is longitudinally aligned adjacent to the pair of differential contact strips and connected to a ground plane of the circuit board substrate, the converging narrowing of the adjacent differential contact strip increasing separation of a distal end of the adjacent differential contact strip from the return current strip, the increased separation improving signal integrity by reducing fringe effects, increasing impedance, and quenching resonance to support high speed communication signals at next generation speeds of greater than 12 Gigabytes per second; and a surface mount device (SMD) having one or more connector pins that correspond to and are attached to the one or more landing pads to conduct high-speed communication signals.

13. The IHS of claim 12, wherein the converging narrowing of each strip comprises a tapered end that provides an increased impedance, which quenches any resonance by the converging, narrowing distal ends of the strip.

14. The IHS of claim 12, wherein the converging narrowing of each strip comprises a rounded end that provides an increased impedance, which quenches any resonance by the converging, narrowing distal ends of the strip.

* * * * *